(12) United States Patent
Rachmady et al.

(10) Patent No.: US 7,879,739 B2
(45) Date of Patent: Feb. 1, 2011

(54) THIN TRANSITION LAYER BETWEEN A GROUP III-V SUBSTRATE AND A HIGH-K GATE DIELECTRIC LAYER

(75) Inventors: Willy Rachmady, Beaverton, OR (US); James Blackwell, Portland, OR (US); Suman Datta, Beaverton, OR (US); Jack T. Kavalieros, Portland, OR (US); Mantu K. Hudait, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 893 days.

(21) Appl. No.: 11/382,428

(22) Filed: May 9, 2006

(65) Prior Publication Data

US 2007/0264837 A1    Nov. 15, 2007

(51) Int. Cl.
*H01L 21/31* (2006.01)
*H01L 21/469* (2006.01)

(52) U.S. Cl. .................. 438/780; 438/781; 438/240; 438/201; 438/211; 438/257; 257/642; 257/759; 257/40; 257/310

(58) Field of Classification Search .................. 438/197, 438/201, 211, 257, 584, 585, 586, 588, 591, 438/593, FOR. 203, FOR. 177, FOR. 494, 438/FOR. 135, 240, 780, 781; 257/642, 257/759, 40, 310
See application file for complete search history.

(56) References Cited

U.S. PATENT DOCUMENTS

| | | | |
|---|---|---|---|
| 4,566,173 A * | 1/1986 | Gossler et al. ............... | 438/762 |
| 7,160,779 B2 * | 1/2007 | Doczy et al. ................ | 438/283 |
| 7,371,633 B2 * | 5/2008 | Lee et al. .................... | 438/216 |
| 7,405,482 B2 * | 7/2008 | Lee et al. .................... | 257/760 |
| 7,465,982 B2 * | 12/2008 | Ahn et al. ................... | 257/310 |
| 2005/0101159 A1 * | 5/2005 | Droopad .................... | 438/785 |
| 2005/0181619 A1 * | 8/2005 | Hwu et al. .................. | 438/745 |
| 2006/0060930 A1 | 3/2006 | Metz | |
| 2007/0001241 A1 * | 1/2007 | Lim et al. ................... | 257/410 |
| 2008/0200019 A9 * | 8/2008 | Huotari et al. ............. | 438/585 |
| 2009/0214870 A1 * | 8/2009 | Morita et al. ............... | 428/413 |

OTHER PUBLICATIONS

U.S. Appl. No. 11/292,399, Justin K. Brask et al.
U.S. Appl. No. 11/323,688, Suman Datta et al.
U.S. Appl. No. 11/391,510, Mantu Hudait et al.
H.C. Lin, et al., "Leakage current and breakdown electric-field studies on ultrathin atomic-layer-deposited Al2O3 on GaAs", Applied Physics letters 87, 182904 (2005).
Xu Min, et al., "Effect of Trimethyl Aluminium Surface Pretreatment on Atomic Layer Deposition Al2O3 Ultra-Thin Film on Si Substrate", vol. 22, No. 9(2005) 2418, 4 pages.

* cited by examiner

*Primary Examiner*—Thao X Le
*Assistant Examiner*—Thanh Y Tran
(74) *Attorney, Agent, or Firm*—Blakely, Sokoloff, Taylor & Zafman LLP

(57) ABSTRACT

Embodiments of the invention provide a method to form a high-k dielectric layer on a group III-V substrate with substantially no oxide of the group III-V substrate between the substrate and high-k dielectric layer. Oxide may be removed from the substrate. An organometallic compound may form a capping layer on the substrate from which the oxide was removed. The high-k dielectric layer may then be formed, resulting in a thin transition layer between the substrate and high-k dielectric layer and substantially no oxide of the group III-V substrate between the substrate and high-k dielectric layer.

7 Claims, 7 Drawing Sheets

Capping Layer 402

III-V Substrate Layer
102

THIN TRANSITION LAYER BETWEEN A GROUP III-V SUBSTRATE AND A HIGH-K GATE DIELECTRIC LAYER

BACKGROUND OF THE INVENTION

In many complementary metal oxide semiconductor (CMOS) logic operations it is desirable to have high mobility material for both NMOS and PMOS transistors. With silicon (Si) substrates, low electron or hole mobility values limit speed and increase power consumption. High electron and hole mobility substrate materials, such as indium antimonide (InSb) may greatly improve logic performance.

Forming the gate dielectric of CMOS devices from certain high-k dielectric materials can reduce gate leakage. When conventional processes are used to form such transistors, a layer of an oxide of the substrate may form between the high-k dielectric and the substrate. The presence of that oxide layer may unfavorably contribute to the overall electrical thickness of the gate dielectric stack.

DETAILED DESCRIPTION

In various embodiments, an apparatus and method relating to the formation of a high-k dielectric layer on a group III-V substrate with little to no oxide of the substrate between the substrate and dielectric layer are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1A:
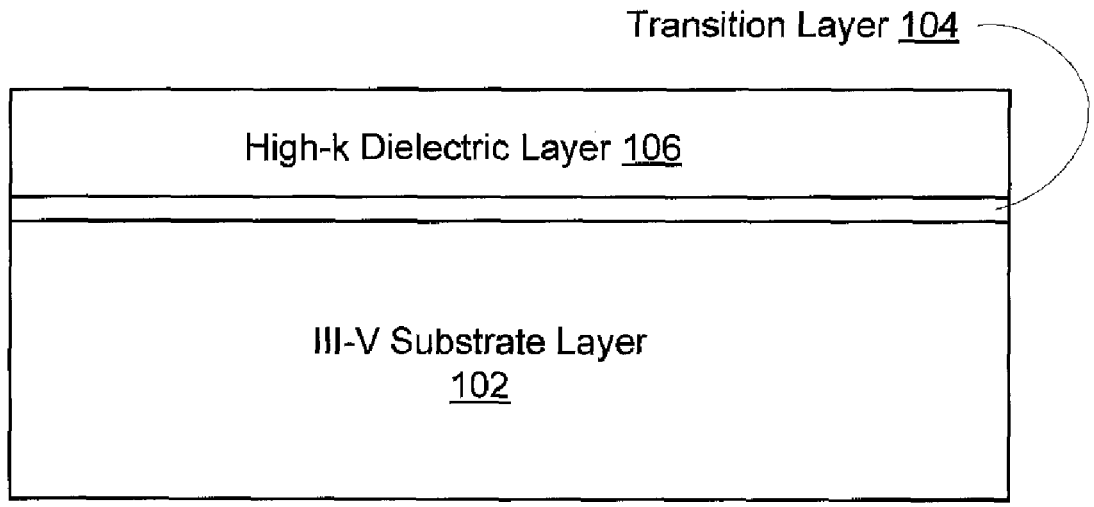
FIG. 1a is a cross sectional side view that illustrates a group III-V substrate with a high-k dielectric layer on the substrate and a thin transition layer between the high-k dielectric layer and substrate.

FIG. 1a is a cross sectional side view that illustrates a group III-V substrate 102 with a high-k dielectric layer 106 on the substrate 102 and a thin transition layer 104 between the high-k dielectric layer 106 and substrate 102, according to one embodiment of the present invention.

The group III-V substrate 102 may comprise a group III-V material. A group III-V material includes at least one element from group III of the periodic table and an element from group V. Examples of such group III-V materials include gallium arsenide (GaAs), indium arsenide (InAs), indium phosphide (InP), aluminium antimonide (AlSb), indium antimonide (InSb), InAlSb, and InGaAs. Other III-V materials not listed may also be used. The substrate 102 may include a layer of a group III-V material and may also include additional layers or materials. For example, the substrate 102 may include an upper layer of a group III-V material, and a lower layer (not shown) of silicon, germanium, gallium arsenide, or another material. The upper layer of group III-V material may, for example, be about 120 angstroms thick, although it may have other thicknesses in alternative embodiments. Additional layers, such as a buffer layer between a group III-V material layer and a lower layer, or materials may also be included as part of the substrate 102.

The high-k dielectric layer 106 may comprise a material with a dielectric constant value greater than 10. In another embodiment, the high-k dielectric layer 106 may comprise a material with a dielectric constant value greater than that of silicon dioxide. The high-k dielectric layer 106 may include a metal cation as part of the high-k material. For example, the high-k dielectric layer 106 may comprise $Al_2O_3$, where the Al is the metal cation, and the layer 106 has a k-value of about 12. In other embodiments, the high-k gate dielectric layer 106 may have a k-value between about 15 and about 25, e.g. $HfO_2$. In yet other embodiments, the high-k gate dielectric layer 106 may have a k-value even higher, such as 35, 80 or even higher. In various embodiments, the high-k dielectric layer 106 may comprise another material, such as hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, lead scandium tantalum oxide, lead zinc niobate, or another high-k dielectric material.

In some embodiments, the high-k gate dielectric layer 106 may be less than about 40 angstroms thick. In other embodiments, the high-k gate dielectric layer 106 may be between about 5 angstroms and about 20 angstroms thick.

There may be a thin transition layer 104 between the substrate 102 and high-k dielectric layer 106. There may be substantially no oxide of the substrate 102 material between the substrate 102 and high-k dielectric layer 106. In an embodiment, the thin transition layer 104 may consist essentially of a monolayer of oxygen. In an embodiment, the thin transition layer 104 may be about 5 angstroms thick or less.

Figure 1B:
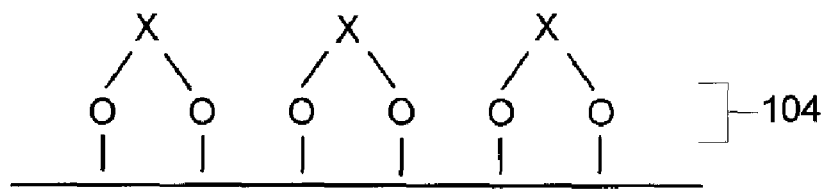
FIG. 1b is a cross sectional side view that illustrates a portion of the group III-V substrate, high-k dielectric layer, and thin transition layer of FIG. 1a in a close-up view to show more detail.

FIG. 1*b* is a cross sectional side view that illustrates a portion of the group III-V substrate 102, high-k dielectric layer 106, and thin transition layer 104 of FIG. 1*a* in a close-up view to show more detail. The high-k dielectric layer 106 of FIG. 1*b* comprises a material with a metal cation (denoted "X" in FIG. 1*b*). Between the group III-V substrate 102 and the high-k dielectric layer 106 is the transition layer 104, which in this embodiment consists essentially of an oxygen monolayer (denoted "O" in FIG. 1*b*). The oxygen is bonded to the substrate 102 below and to the metal cation of the high-k dielectric layer 106 above. Thus, the result in this embodiment is that the transition layer 104 is an oxygen monolayer. In other embodiments, the transition layer 104 may comprise other materials. As seen in FIG. 1*b*, there is substantially no oxide of the substrate 102 between the substrate 102 and the high-k dielectric layer 106.

FIGS. 2 through 5 are cross-sectional side views that illustrate how the device of FIG. 1 may be formed with substantially no oxide of the substrate 102 between the substrate 102 and the high-k dielectric layer 106.

Figure 2:
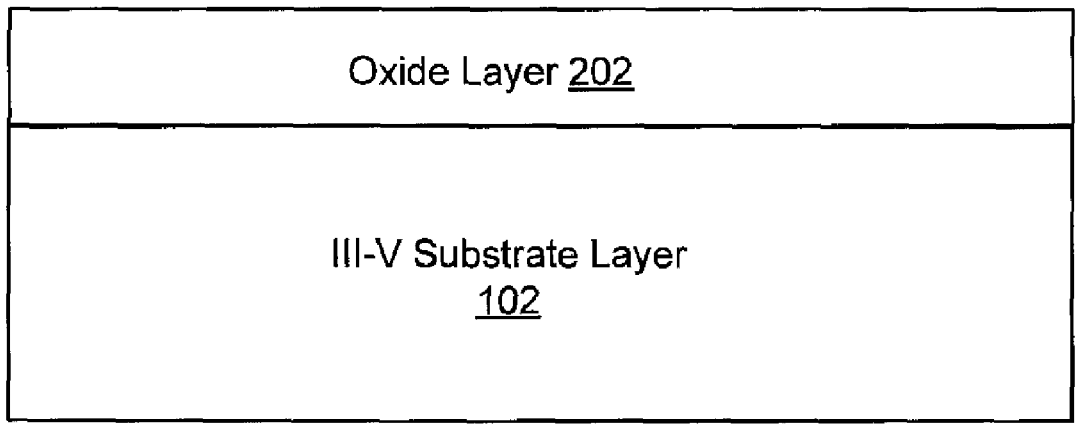
FIG. 2 is a cross-sectional side view that illustrates the III-V substrate.

FIG. 2 is a cross-sectional side view that illustrates the III-V substrate 102 according to one embodiment of the present invention. The substrate 102 may begin with a layer 202 of an oxide of the III-V material. This oxide layer 202 may be a complex multilayer oxide layer 202 formed by a reaction of ambient oxygen with the substrate 102 material. In some embodiments, this oxide layer 202 may be as much as 80 angstroms thick, although it may have other thicknesses in other embodiments. If this oxide layer 202 were to remain in place and a transistor with a gate dielectric and gate electrode formed on it, the oxide layer 202 would adversely affect the performance of the transistor.

Figure 3:
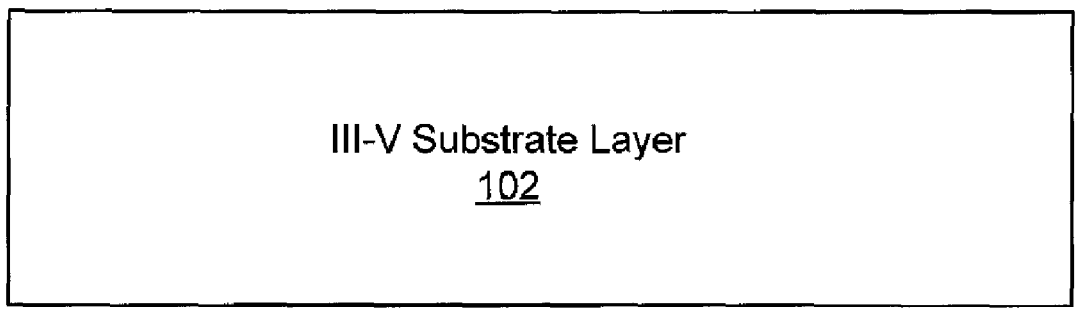
FIG. 3 is a cross-sectional side view that illustrates the III-V substrate after the oxide layer has been removed.

FIG. 3 is a cross-sectional side view that illustrates the III-V substrate 102 after the oxide layer 202 has been removed. The oxide layer 202 may be removed by any suitable method. In an embodiment, the oxide layer 202 is removed by a halide acid (e.g., HF, HBr, HCl, or HI) followed by rinsing with deionized water. After removal of the oxide layer 202, the top surface of the substrate 102 may be a stoichiometric surface terminated by OH groups.

Figure 4A:
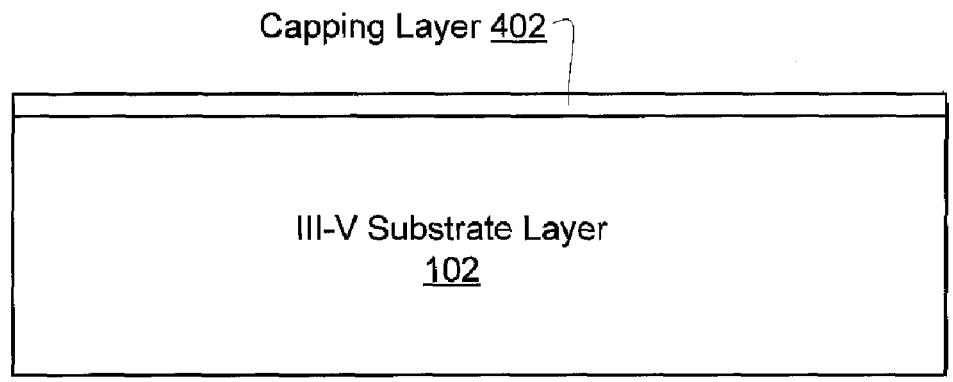
FIG. 4a is a cross-sectional side view that illustrates a capping layer formed on the surface of the substrate.

FIG. 4*a* is a cross-sectional side view that illustrates a capping layer 402 formed on the surface of the substrate 102, according to one embodiment of the present invention. The capping layer 402 may be formed by exposing the top surface of the substrate 102 to an organometallic compound that includes a metal cation, a ligand, and a bulky leaving group. The metal cation of the organometallic compound may be the same as a metal cation of the high-k dielectric layer 106 that is to be formed later. The organometallic material may be delivered in a solvent, such as methanol, ethylene glycol, diethyl ether, or toluene, and the capping layer 402 may be formed by liquid phase adsorption.

In some embodiments, reoxidation of the substrate 102 surface between removal of the oxide layer 202 and formation of the capping layer 402 is prevented. This may be done by exposing the substrate 102 surface to the organometallic material while the substrate 102 surface is still covered by liquid (e.g., deionized water) from the oxide layer 202 removal process. In anther embodiment, the ambient environment around the substrate 102 is kept free of oxygen between the time the oxide layer 202 is removed and the formation of the capping layer 402.

Figure 4B:
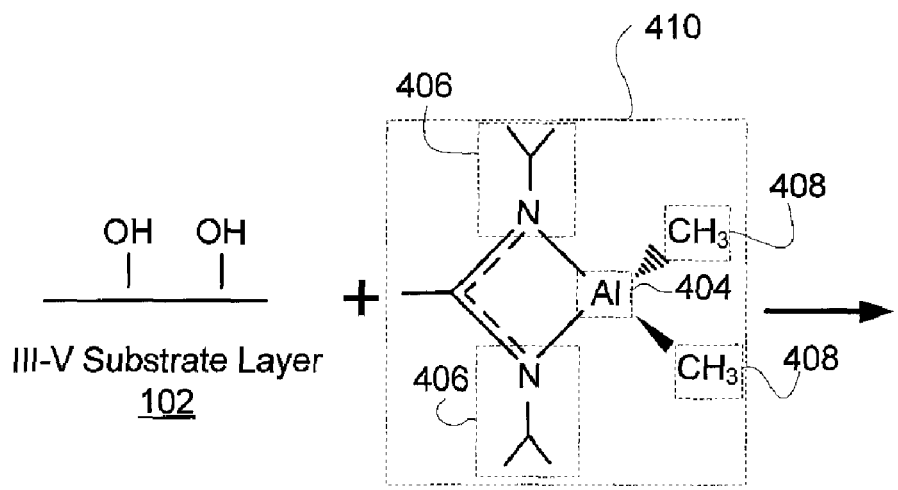
FIG. 4b illustrates a reaction between an example organometallic molecule and the substrate layer that results in the capping layer.
Figure 4B:
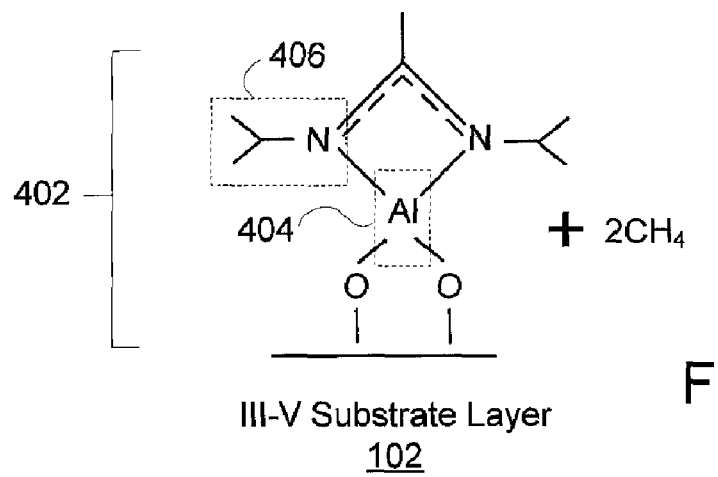

FIG. 4*b* illustrates a reaction between an example organometallic molecule and the substrate layer 102 that results in the capping layer 402, according to one embodiment of the present invention. The substrate layer 102, terminated by OH groups, may react with the organometallic molecule 410. In the illustrated embodiment, the organometallic molecule 410 includes a metal cation 404 (Al in this case, although it may be other elements in other embodiments), bulky leaving groups 406, and ligands 408. In various embodiments, the bulky leaving groups 406 may comprise: amidinate, guanidinate, or another chelating amido-type ligand; bis-trimethlysilylamido, dimethylamido, or another dialkylamido group; tert-butoxy or another alkoxy or aryloxy group; a substituted cyclopentadienyl group such as pentamethylcyclopentadiene; acetylacetone or another chelating alkoxy ligand; tert-butyl, trimethylsilymethyl, benzyl, or another alkyl group. In other embodiments, the bulky leaving group 406 may comprise other materials. After the reaction, the metal cation 404 is bonded to oxygen bonded to the substrate 102, with the bulky leaving groups 406 opposite the substrate surface. The capping layer 402 comprises the oxygen, metal cation 404, and bulky leaving groups 406, and may protect the substrate 102 from reoxidation, even if the substrate 102 is exposed to oxygen after this point.

Figure 5A:
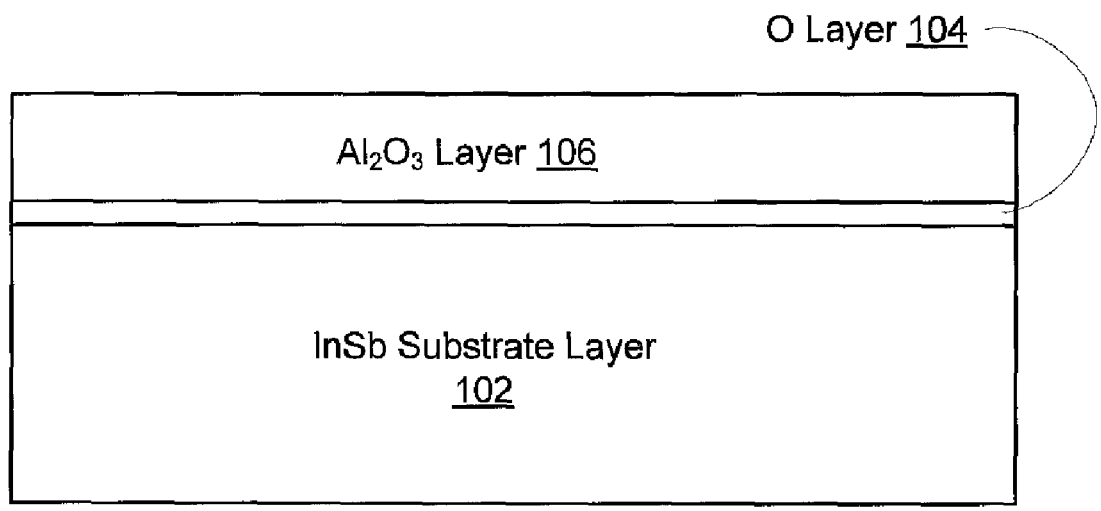
FIG. 5a is a cross-sectional side view that illustrates the substrate after the high-k dielectric layer and transition layer have been formed.

FIG. 5*a* is a cross-sectional side view that illustrates the substrate 102 after the high-k dielectric layer 106 and transition layer 104 have been formed, according to one embodiment of the present invention. In this embodiment, the group III-V material of the substrate 102 is InSb, the transition layer 104 substantially consists of a monolayer of oxygen, and the high-k dielectric layer 106 comprises $Al_2O_3$. FIG. 5*a* is thus a specific instance of the generalized layers of FIG. 1*a*. In other embodiments, the substrate 102, transition layer 104, and high-k dielectric layer 106 may comprise other materials.

In an embodiment, the high-k dielectric layer 106 is formed by atomic layer deposition (ALD). In another embodiment, the high-k dielectric layer 106 is formed by a physical vapor deposition, or sputtering, process in a reducing environment. In other embodiments, the high-k dielectric layer 106 is formed by other processes.

Figure 5B:
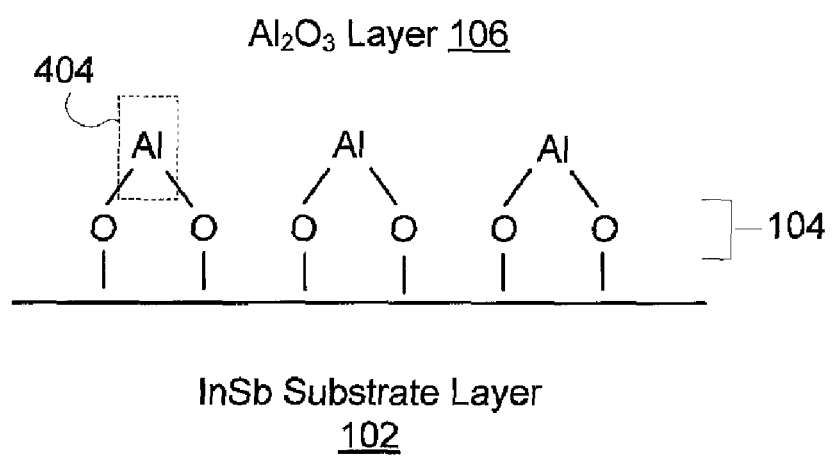
FIG. 5b is a cross sectional side view that illustrates a portion of the InSb substrate, $Al_2O_3$ high-k dielectric layer, and thin transition layer of FIG. 5a in a close-up view to show more detail.

FIG. 5*b* is a cross sectional side view that illustrates a portion of the InSb substrate 102, $Al_2O_3$ high-k dielectric layer 106, and thin transition layer 104 of FIG. 5*a* in a close-up view to show more detail. The metal cation, Al, of the high-k dielectric layer 106 is the same element as the metal cation 404 of the organometallic material 410, so that metal cation 404 of the organometallic material 410 may become part of the high-k dielectric layer 106. The bulky leaving group 406 has been displaced during the process used to make the high-k dielectric layer 106. The oxygen monolayer "O"

that was part of the capping layer 402 now forms the transition layer 104 (an oxygen monolayer in this embodiment, although it may be other things in other embodiments) between the substrate 102 and high-k dielectric layer 106. There is substantially no oxide of the substrate 102 between the substrate 102 and the high-k dielectric layer 106, as reoxidation of the substrate 102 was prevented between removal of the oxide layer 202 and formation of the capping layer 402, and the capping layer 402 prevented reoxidation until the high-k dielectric layer 106 was formed.

Figure 6:
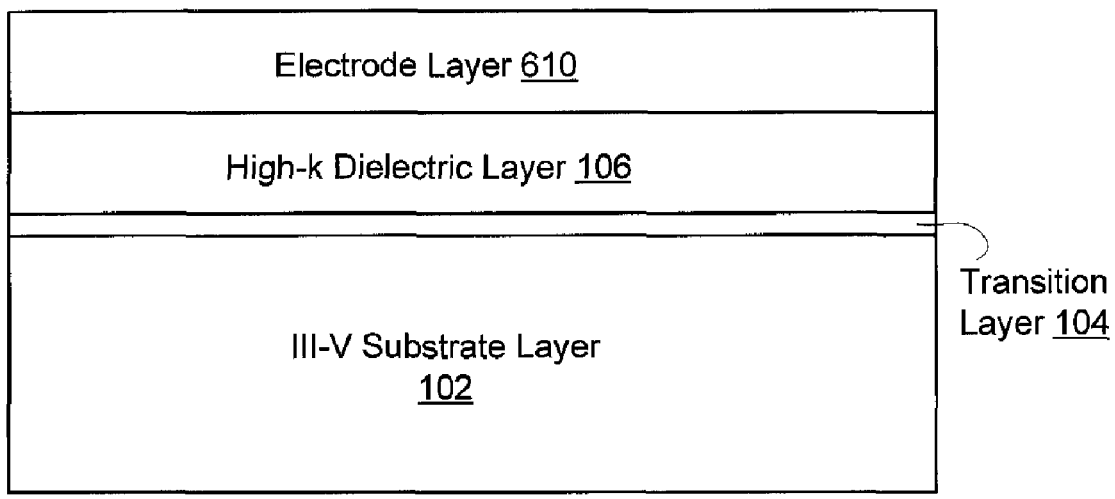
FIG. 6 is a cross-sectional side view that illustrates an electrode layer that may be formed on the high-k dielectric layer.
Figure 7:
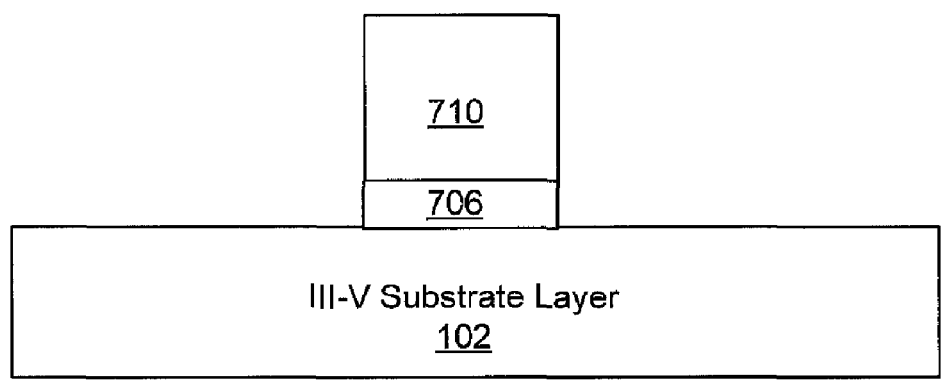
FIG. 7 is a cross-sectional side view that illustrates a gate electrode and gate dielectric layer formed by patterning the electrode layer and high-k dielectric layer.
Figure 8:
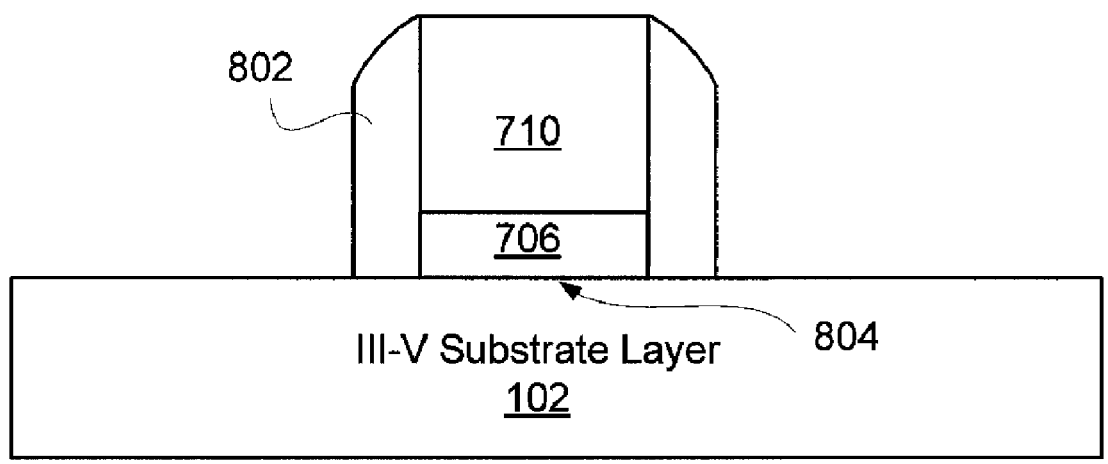
FIG. 8 is a cross-sectional side view that illustrates spacers formed adjacent the gate electrode and gate dielectric layer.

FIGS. 6 through 8 are cross-sectional side views that illustrate how a transistor device may be formed with substantially no oxide of the substrate 102 beneath at least a portion of the gate electrode of the transistor. The example shown in FIGS. 6 through 8 is but illustrative; many other ways to make transistors may be used.

FIG. 6 is a cross-sectional side view that illustrates an electrode layer 610 that may be formed on the high-k dielectric layer 106. The electrode layer 610 may comprise a polysilicon material, a metal material, or another material, and may optionally be a sacrificial electrode material.

FIG. 7 is a cross-sectional side view that illustrates a gate electrode 710 and gate dielectric layer 706 formed by patterning the electrode layer 610 and high-k dielectric layer 106. Any suitable method may be used for patterning.

FIG. 8 is a cross-sectional side view that illustrates spacers 802 formed adjacent the gate electrode 710 and gate dielectric layer 706. Source and drain regions (not shown) may also be formed adjacent the spacers 802, and a channel region may be beneath the gate dielectric layer 706. Because there was substantially no oxide of the substrate 102 between the substrate 102 and high-k dielectric layer 106, there may be substantially no oxide of the substrate beneath the gate dielectric layer 706 in FIG. 8. In other embodiments, there may be some lateral oxidation beneath the right and left edges of the gate dielectric layer 706, but the central portion may remain free from such oxide.

Figure 9:
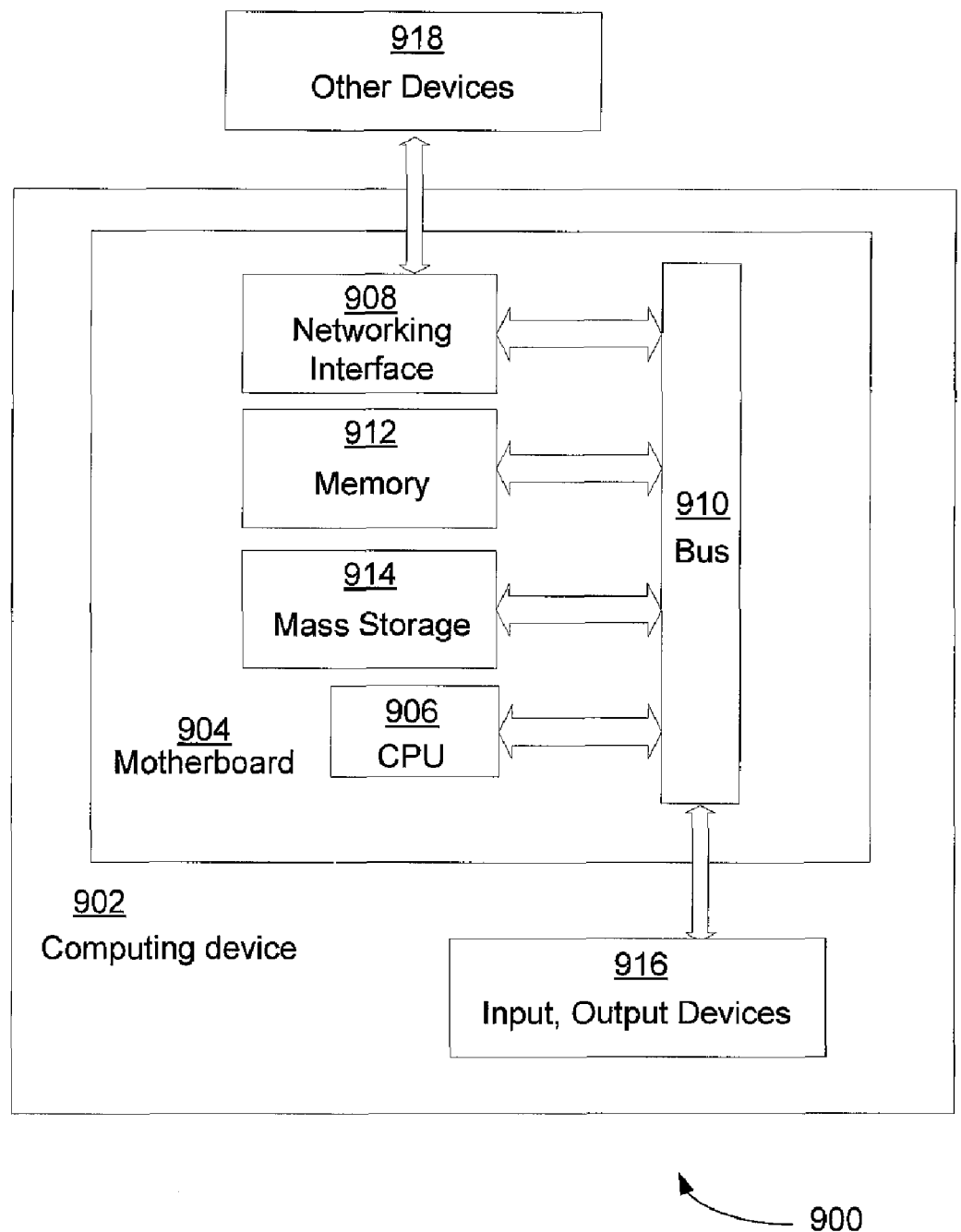
FIG. 9 illustrates a system in accordance with one embodiment of the present invention.

FIG. 9 illustrates a system 900 in accordance with one embodiment of the present invention. One or more devices formed with the transition layer 104 and substantially free of oxide between the substrate 102 and high-k dielectric layer 106 as described above may be included in the system 900 of FIG. 9. As illustrated, for the embodiment, system 900 includes a computing device 902 for processing data. Computing device 902 may include a motherboard 904. Coupled to or part of the motherboard 904 may be in particular a processor 906, and a networking interface 908 coupled to a bus 910. A chipset may form part or all of the bus 910. The processor 906, chipset, and/or other parts of the system 900 may include one or more devices substantially free of oxide between the III-V substrate 102 and high-k gate dielectric layer 706 as described above.

Depending on the applications, system 900 may include other components, including but are not limited to volatile and non-volatile memory 912, a graphics processor (integrated with the motherboard 904 or connected to the motherboard as a separate removable component such as an AGP or PCI-E graphics processor), a digital signal processor, a crypto processor, mass storage 914 (such as hard disk, compact disk (CD), digital versatile disk (DVD) and so forth), input and/or output devices 916, and so forth.

In various embodiments, system 900 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method for forming a semiconductor device, comprising:
   removing a surface oxide from a top surface of a substrate comprising a group III-V material;
   forming, after removing the surface oxide, a capping layer comprising an organometallic component comprising a metal cation bonded to a carbon atom on the top surface of the substrate from which the surface oxide was removed, wherein substantially no additional oxide formed on the top surface of the substrate after the surface oxide was removed and before forming the capping layer; and
   forming, after forming the capping layer, a high-k gate dielectric layer comprising the same metal cation as the capping layer wherein there is substantially no oxide between said substrate and said high k gate dielectric.

2. The method of claim 1, wherein forming the capping layer comprises exposing the top surface to an organometallic compound that includes the metal cation, wherein the organometallic compound is adsorbed by the top surface to form the capping layer.

3. The method of claim 2, wherein the organometallic compound comprises the metal cation, a ligand, and a bulky leaving group.

4. The method of claim 3, wherein the high-k dielectric layer consists essentially of $Al_2O_3$, the metal cation is Al, the ligand comprises $CH_3$, and the bulky leaving group comprises amidinate.

5. The method of claim 3, wherein forming the high-k dielectric layer comprises forming the high-k dielectric layer by atomic layer deposition, during which the bulky leaving group is displaced, leaving a thin transition layer between the high-k dielectric layer and the substrate.

6. The method of claim 5, wherein the thin transition layer consists essentially of a monolayer of oxygen.

7. The method of claim 1, further comprising:
   forming an electrode layer on the high-k dielectric layer;
   patterning the high-k dielectric and electrode layers; and
   forming spacers adjacent the patterned high-k dielectric and electrode layers.

* * * * *